US012422464B2

(12) United States Patent
Orner et al.

(10) Patent No.: US 12,422,464 B2
(45) Date of Patent: Sep. 23, 2025

(54) INSULATION MONITOR AND METHOD FOR OPERATING SAME

(71) Applicant: MERCEDES-BENZ GROUP AG, Stuttgart (DE)

(72) Inventors: Markus Orner, Rennigen (DE); Akin Candir, Filderstadt (DE); Urs Boehme, Ehningen (DE)

(73) Assignee: MERCEDES-BENZ GROUP AG, Stuttgart (DE)

( * ) Notice: Subject to any disclaimer, the term of this patent is extended or adjusted under 35 U.S.C. 154(b) by 137 days.

(21) Appl. No.: 18/292,401

(22) PCT Filed: Jul. 1, 2022

(86) PCT No.: PCT/EP2022/068325
§ 371 (c)(1),
(2) Date: Jan. 26, 2024

(87) PCT Pub. No.: WO2023/006339
PCT Pub. Date: Feb. 2, 2023

(65) Prior Publication Data
US 2024/0219445 A1    Jul. 4, 2024

(30) Foreign Application Priority Data
Jul. 27, 2021 (DE) .................... 10 2021 003 843.6

(51) Int. Cl.
*G01R 31/14* (2006.01)
(52) U.S. Cl.
CPC .................... *G01R 31/14* (2013.01)
(58) Field of Classification Search
CPC ......... G01R 31/52; G01R 27/18; G01R 31/50
(Continued)

(56) References Cited

U.S. PATENT DOCUMENTS

| 7,626,396 B2 | 12/2009 | Lindsey et al. |
| 2013/0258531 A1* | 10/2013 | Li .................. B60L 3/0069 324/509 |
| 2022/0057443 A1* | 2/2022 | Trunk .................. G01R 31/343 |

FOREIGN PATENT DOCUMENTS

| DE | 102018004109 A1 | 1/2019 |
| DE | 102017218586 A1 | 4/2019 |

(Continued)

OTHER PUBLICATIONS

International Search Report and Written Opinion mailed Nov. 21, 2022 in related/corresponding International Application No. PCT/EP2022/068325.

(Continued)

*Primary Examiner* — Roberto Velez
(74) *Attorney, Agent, or Firm* — PATENT PORTFOLIO BUILDERS PLLC

(57) ABSTRACT

An insulation monitor for a high-voltage onboard electrical system of a motor vehicle is provided. A respective Y-capacitor is arranged between the positive potential and the vehicle earth and between the negative potential and the vehicle earth. The insulation monitor has a current or voltage source, a voltmeter for measuring at least one of the potentials, and is configured to apply a negative current by the current source when the potential measured by the voltmeter exceeds a predefined upper value and to apply a positive current by the current source when the potential measured by the voltmeter falls below a predefined lower value. The current thus being limited to a maximum permissible contact current in the case of an insulation fault and it is possible to infer the magnitude of the insulation resistances using the voltage measured by the voltmeter and the recharging current that has been fed in.

4 Claims, 2 Drawing Sheets

Figure 1:
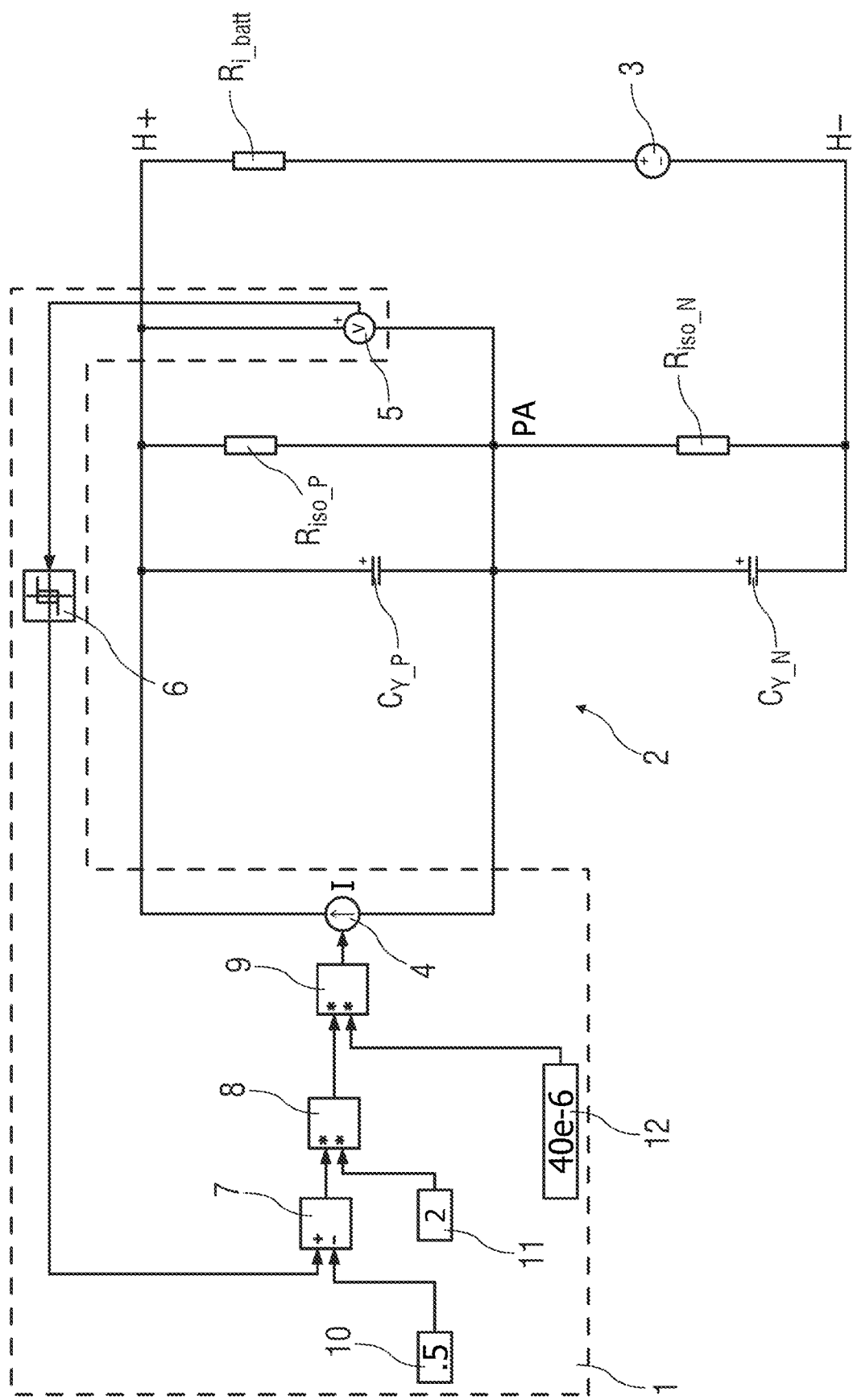

(58) Field of Classification Search
USPC .......................................... 324/551, 509, 522
See application file for complete search history.

(56) References Cited

FOREIGN PATENT DOCUMENTS

| | | |
|---|---|---|
| DE | 102018211625 A1 | 1/2020 |
| DE | 102019202892 A1 | 9/2020 |
| DE | 102020102658 A1 | 8/2021 |
| DE | 102021003180 A1 | 8/2021 |
| EP | 3640076 A1 | 4/2020 |

OTHER PUBLICATIONS

International Search Report and Written Opinion mailed Nov. 24, 2022 in related/corresponding International Application No. PCT/EP2022/070950.
Office Action created Apr. 26, 2022 in related/corresponding DE Application No. 10 2021 003 844.4.
Office Action created Jul. 14, 2022 in related/corresponding DE Application No. 10 2021 003 843.6.
Search Report created Apr. 12, 2022 in related/corresponding DE Application No. 10 2021 003 843.6.

* cited by examiner

INSULATION MONITOR AND METHOD FOR OPERATING SAME

BACKGROUND AND SUMMARY OF THE INVENTION

Exemplary embodiments of the invention relate to an insulation monitor for a high-voltage onboard electrical system of a motor vehicle, as well as to a method for operating same.

DE 10 2019 202 892 A1 discloses an onboard electrical system for a motor vehicle, wherein the onboard electrical system has a high-voltage energy store for providing a first high-voltage potential and a second high-voltage potential that is different from the first, so that a total voltage can be tapped off between the first and the second high-voltage potential. Furthermore, the onboard electrical system has a first insulation resistance between the first high-voltage potential and a predetermined electrical earth and a second insulation resistance between the second high-voltage potential and the predetermined electrical earth and an insulation monitoring device which is designed to monitor the first and second insulation resistance. The HV (high-voltage) onboard electrical system of a vehicle having an electric drive typically consists of at least one HV battery with battery contactors and HV consumers, for example a pulse inverter. As a rule, the high-voltage onboard electrical system is implemented as an IT (isole-terre) network and is therefore completely galvanically isolated from the vehicle earth. However, parasitic resistances in the cables, HV consumers, the battery, and so on result in a high impedance connection between the positive or negative high-voltage potential and the vehicle earth, known as insulation resistance, or the abovementioned respective first and second insulation resistances. Provided this resistance has a high impedance, i.e., in the megaohm range, it poses no risk. For safety reasons, this insulation resistance is permanently monitored by means of an insulation monitoring device, also known as an insulation monitor. If the value falls below a defined threshold, a warning can be generated and, depending on the operating state, the HV onboard electrical system can be disconnected from the battery via the battery contactors and a safe state can be established.

In addition to the insulation resistance, there are capacitances in every HV onboard electrical system, in particular so-called earth capacitances, which are located between the HV connections and the vehicle earth. These result from parasitic effects, caused for example by cable shields, and are even deliberately installed to improve the EMC (electromagnetic compatibility) behavior. According to the formula $E=\frac{1}{2} C U^2$, energy E is stored in these capacitors with capacitance C when a voltage U is applied. If a person then touches a high-voltage contact and the vehicle earth at the same time, these capacitors are discharged or recharged via the person's body and could in principle, i.e., if these currents were too high, be dangerous. In order to minimize the potential risk, various standards therefore have limit values for the maximum, in other words effective, amount of energy permitted to be stored in the capacitors. The direct consequence of this is that the maximum permissible total capacitance is limited as a function of the HV total voltage. In addition, for safety reasons, the worst case should be expected and a maximum unbalanced HV onboard electrical system should be assumed, which occurs when the voltage of a HV terminal measured against earth corresponds to almost all of the HV voltage. This can occur, inter alia, due to dirt resistances or leakage currents over the service life.

By limiting the maximum permissible total capacitance as described above, there is therefore no hazard potential even if the onboard electrical system is unbalanced, i.e., if the voltages between the positive high-voltage potential and earth and between the negative high-voltage potential and earth are different. In addition to the disadvantage of limiting the maximum permissible total capacitance, it is also possible in this case, i.e., if the onboard electrical system is unbalanced, that when the vehicle is connected to a charging station, for example via the DC charging interface, the positive or negative voltage potential with respect to earth of the charging station and vehicle is different. This can lead to undesired, undefined balancing processes when the charging station is switched on, which in the worst case can prevent charging.

Exemplary embodiments of the invention are directed to an improved insulation monitor for a high-voltage onboard electrical system of a motor vehicle and an improved method for operating the same.

According to the invention, an insulation monitor for a high-voltage onboard electrical system of a motor vehicle is disclosed, the onboard electrical system comprising a HV battery and being galvanically isolated from a vehicle earth, with there being a respective insulation resistance between a positive potential of the HV battery and the vehicle earth and between a negative potential of the HV battery and the vehicle earth as a result of parasitic effects, a respective Y-capacitor being provided between the positive potential and the vehicle earth and between the negative potential and the vehicle earth, wherein the insulation monitor has a current source or a voltage source for recharging the Y-capacitors, wherein the current source is connected between the vehicle earth and one of the potentials, wherein the insulation monitor also comprises a voltmeter for measuring at least one of the potentials.

According to the invention, the current source or the voltage source is further configured to balance the potentials, wherein the insulation monitor is configured to impress a negative current by means of the current source when the potential measured by the voltmeter exceeds a predefined upper value and to impress a positive current by means of the current source when the potential measured by the voltmeter falls below a predefined lower value, the current being limited to a maximum permissible contact current in the case of an insulation fault, and to infer the magnitude of the insulation resistances using the voltage measured by the voltmeter and using the recharging current that has been fed in.

When using the insulation monitor according to the invention, the deviation of the HV potential distribution from a balanced HV potential distribution is very small. The energy content/the charge stored in the Y-capacitors is thus always very close to an achievable minimum. As a result, a larger Y-capacitor can be permitted in the HV system in order to still fulfil the legal requirements regarding the stored energy/charge. More favorable/better EMC filtering in the HV components is thus possible.

Exemplary embodiments of the invention are explained in more detail hereinbelow with reference to drawings.

BRIEF DESCRIPTION OF THE DRAWING FIGURES

Figure 2:
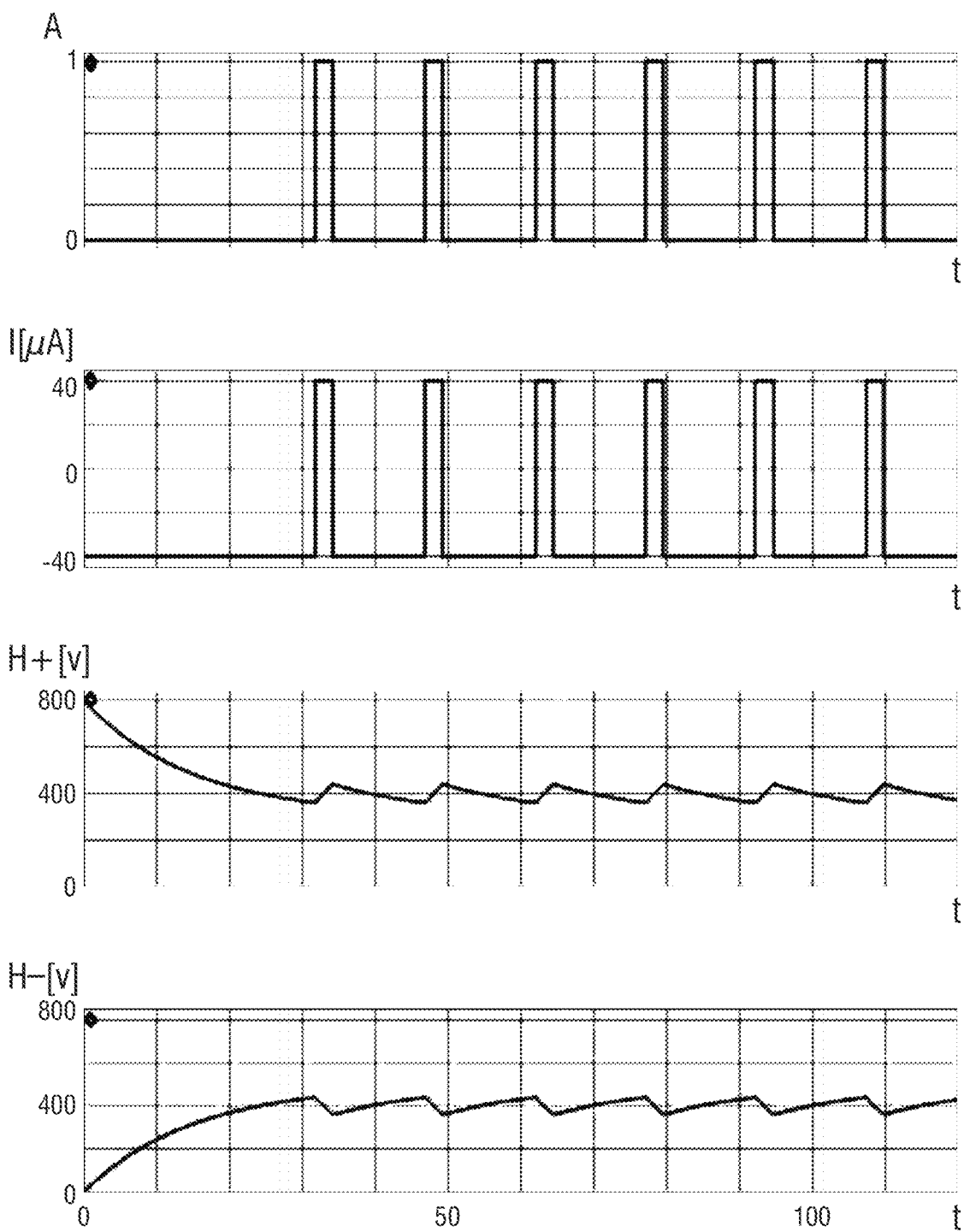

In the drawings:

FIG. 1 shows a schematic view of an insulation monitor for an onboard electrical system of a motor vehicle, and FIG. 2 shows schematic diagrams for illustrating an output of a relay, a current impressed by a current source, and potentials over time.

Mutually corresponding parts are provided with the same reference signs throughout the figures.

DETAILED DESCRIPTION

FIG. 1 is a schematic view of an insulation monitor 1, in particular for an onboard electrical system 2 of a motor vehicle, preferably of a motor vehicle having an electric drive.

The onboard electrical system 2 is, by way of example, a HV (high-voltage) onboard electrical system and typically comprises at least one HV battery 3 and HV consumers, not shown here. The figure furthermore shows an internal resistance $R_{i\_batt}$ of the HV battery 3. As a rule, the onboard electrical system 2 is galvanically isolated from a vehicle earth PA. Parasitic effects result in a respective insulation resistance $R_{iso\_P}$, $R_{iso\_N}$ between a positive potential H+ and the vehicle earth PA and between a negative potential H− and the vehicle earth PA. For safety reasons, an insulation monitor 1 is provided to monitor the insulation resistance $R_{iso\_P}$, $R_{iso\_N}$. Respective Y-capacitors $C_{Y\_P}$, $C_{Y\_N}$ are also provided between the positive potential H+ and the vehicle earth PA and between the negative potential H− and the vehicle earth PA. Although the figure does not explicitly show the line resistances associated with the $C_{Y\_P}$, $C_{Y\_N}$, they are unavoidable in real circuits, just as the internal resistance $R_{i\_batt}$ of the HV battery 3 is also not deliberately installed separately.

The high-voltage battery 3 can have a rated voltage of 800 V, for example.

The insulation monitor 1 comprises a current source 4, for example a galvanically isolated current source for recharging the Y-capacitors $C_{Y\_P}$, $C_{Y\_N}$ and for balancing the potentials H+ and H−. For this purpose, the current source 4 is connected between the vehicle earth PA and one of the potentials H+ or H−, in this case the potential H+. The insulation monitor 1 also comprises a voltmeter 5 for measuring one of the potentials H+ or H−, in this case the potential H+. In addition, the insulation monitor 1 comprises a control device, that controls or regulates a recharging current I to be impressed by the current source 4 depending on the value of the potential H+ measured by the voltmeter 5. The control device is represented in the figure by a relay 6, an addition element 7, two multiplication elements 8, 9 and three constant values 10, 11, 12, but it can also be designed in any other way suitable manner. The insulation monitor 1 or its control device is configured in such a way that when the value of the potential H+ measured by the voltmeter 5 exceeds, for example, 440 V, a current I of, for example, −40 pA is impressed by the current source 4, while when the value of the potential H+ measured by the voltmeter 5 falls below, for example, 360 V, a current I of, for example, +40 pA is impressed by the current source 4. The insulation monitor 1 is configured such that it can impress a current I up to a maximum current intensity, which can, in particular, go up to a range of +/−10 mA. In exceptional cases, however, the configuration of the insulation monitor 1 can also impress even higher current intensities.

FIG. 2 shows schematic diagrams to illustrate an output A of the relay 6, the current I impressed by the current source 4, the measured potential H+ and the potential H− over time t.

After a voltage measurement to determine the HV potential distribution by means of the voltmeter 5 to start the onboard electrical system 2, a distribution of the potentials H+, H− that is balanced with respect to the vehicle earth PA is first produced by impressing a current by means of the current source 4. The constant current I, applied by the current source 4 and at which the balanced potential distribution is maintained, is determined for the subsequent calculation of the insulation resistances $R_{iso\_P}$, $R_{iso\_N}$. From this balanced distribution of the potentials H+, H−, a smaller recharging of the potentials H+, H− by a smaller positive and/or negative value around the balanced distribution is effected by feeding in a further additive current I from the current source 4. This current I applied by the current source 4 is limited to a maximum permissible contact current in the case of an insulation fault. Using the measured voltage between the positive potential H+ and the vehicle earth PA or between the negative potential H− and the vehicle earth PA and using the recharging current I that has been fed in, the insulation values, i.e., the magnitude of the insulation resistances $R_{iso\_P}$, $R_{iso\_N}$, can be inferred. In this case the potential distribution changes with a defined voltage swing around the balanced potential distribution. The insulation monitor is thus configured to vary the distribution of the potentials (H+, H−) with a defined voltage swing around the balanced potential distribution, wherein the voltage swing can, for example, be a high two-digit voltage and can in particular be up to a range of +/−50V. In exceptional cases, however, the configuration of the insulation monitor 1 can also impress even higher voltage swings.

In an alternative embodiment, the insulation monitor 1 can have a voltage source, for example a galvanically isolated voltage source, instead of a current source 4 and can determine the magnitude of the insulation resistances $R_{iso\_P}$, $R_{iso\_N}$ by applying a voltage.

FIG. 2 shows simulation results for the case that the insulation resistance $R_{iso\_P}$ is 30 MOhm and that the insulation resistance $R_{iso\_N}$ is 10 MOhm. Starting from a very unbalanced distribution of the potentials H+, H− (i.e. a high energy content in the Y-capacitors $C_{Y\_P}$, $C_{Y\_N}$), the insulation monitor 1 actively produces a balanced distribution of the potentials H+, H−. It can be seen that to reduce the positive potential H+ a negative current I is required for a longer time duration than a positive current I to reduce the negative potential H−, which is caused by the unbalanced resistance distribution. Nevertheless, the insulation monitor 1 can determine the values of the insulation resistances $R_{iso\_P}$, $R_{iso\_N}$ using determined variables such as recharging time and distribution of the potentials H+, H−. Instead of the information about the unbalanced rest position, it now has information about the different duty cycle of the recharging currents 1.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the inven-

LIST OF REFERENCE SIGNS 1 insulation monitor
2 onboard electrical system, HV onboard electrical system
3 HV battery
4 current source
voltmeter
6 relay
7 addition element
8, 9 multiplication element
10, 11, 12 constant value
$C_{Y\_P}$, $C_{Y\_N}$ Y-capacitor
H+, H− potential
I current, recharging current
A output
PA vehicle earth
$R_{i\_batt}$ internal resistance
$R_{iso\_P}$, $R_{iso\_N}$ insulation resistance
t time

The invention claimed is:

1. An insulation monitor for a high-voltage onboard electrical system of a motor vehicle, wherein the onboard electrical system comprises a high-voltage (HV) battery and is galvanically isolated from a vehicle earth, wherein there is a respective insulation resistance between a positive potential of the HV battery and the vehicle earth and between a negative potential of the HV battery and the vehicle earth as a result of parasitic effects, and wherein a respective Y-capacitor arranged between the positive potential and the vehicle earth and between the negative potential and the vehicle earth, the insulation monitor comprising:
    a current source or a voltage source configured to recharge the Y-capacitors, wherein the current source is connected between the vehicle earth and one of the positive and negative potentials;
    a voltmeter configured to measure at least one of the positive and negative potentials,
    wherein the current or voltage source is configured to balance the positive and negative potentials,
    wherein the insulation monitor is configured to
        apply a negative current using the current source when the positive potential measured by the voltmeter exceeds a predefined upper value and to impress a positive current by using the current source when the positive potential measured by the voltmeter falls below a predefined lower value, wherein the current is limited to a maximum permissible contact current in case of an insulation fault, and a magnitude of the insulation resistances is inferable using the voltage measured by the voltmeter and using the recharging current that has been fed in,
        after a voltage measurement, determine a distribution of the positive and negative potentials using the voltmeter to start the onboard electrical system,
        first produce a distribution of the positive or negative potential that is balanced with respect to the vehicle earth by applying a current to determine a constant current applied by the current source and at which the balanced potential distribution is maintained for a subsequent calculation of the insulation resistances, and
        to effect, based on the balanced distribution of the positive or negative potentials, a smaller recharging of the positive and negative potentials by a smaller positive or negative value around the balanced distribution by feeding in a further additive current from the current source.

2. The insulation monitor of claim 1, wherein the high-voltage battery has a rated voltage of 800 V, wherein the insulation monitor is configured to vary the distribution of the positive and negative potentials with a defined voltage swing of +/−50V around the balanced distribution.

3. The insulation monitor of claim 1, wherein the insulation monitor is configured to apply a current up to a maximum current intensity of +/−10 mA.

4. A method for operating an insulation monitor for a high-voltage onboard electrical system of a motor vehicle, wherein the onboard electrical system comprises a high-voltage (HV) battery and is galvanically isolated from a vehicle earth, wherein there is a respective insulation resistance between a positive potential of the HV battery and the vehicle earth and between a negative potential of the HV battery and the vehicle earth as a result of parasitic effects, and wherein a respective Y-capacitor arranged between the positive potential and the vehicle earth and between the negative potential and the vehicle earth, the method comprising:
    recharging, by a current or voltage source of the insulation monitor, the Y-capacitors, wherein the current source is connected between the vehicle earth and one of the positive and negative potentials;
    measuring, by a voltmeter of the insulation monitor, at least one of the positive and negative potentials; and
    applying,
        by the current source responsive to the positive potential measured by the voltmeter exceeding a predefined upper value, a negative current using the current source or
        by the current source responsive to the positive potential measured by the voltmeter falling below a predefined lower value, a positive current using the current source, when the potential measured by the voltmeter falls below a predefined lower value,
        wherein the application of the negative or positive current by the current source causes the current to limited to a maximum permissible contact current in the case of an insulation fault, and allows inferring a magnitude of the insulation resistances using the voltage measured by the voltmeter (5) and using the recharging current that has been fed in,
    wherein the insulation monitor, after a voltage measurement, by the voltmeter,
        determines the distribution of the positive and negative potential to start the onboard electrical system,
        first produces a distribution of the positive and negative potentials that is balanced with respect to the vehicle earth by applying a current to determine a constant current applied by the current source and at which the balanced potential distribution is maintained, for a subsequent calculation of the insulation resistances, and from the determined constant current, and
        effects, based on the balanced distribution of the positive and negative potentials, a smaller recharging of the potentials by a smaller positive or negative value around the balanced distribution by feeding in a further additive current from the current source.

* * * * *